United States Patent [19]
Safir

[11] Patent Number: 5,409,550
[45] Date of Patent: Apr. 25, 1995

[54] SOLAR CELL MODULE

[76] Inventor: Yakov Safir, Giesegårdvej 104, DK-4100 Ringsted, Denmark

[21] Appl. No.: 90,123
[22] PCT Filed: Jan. 21, 1992
[86] PCT No.: PCT/DK92/00017
§ 371 Date: Jul. 22, 1993
§ 102(e) Date: Jul. 22, 1993
[87] PCT Pub. No.: WO92/13362
PCT Pub. Date: Aug. 6, 1992

[30] Foreign Application Priority Data
Jan. 22, 1991 [DK] Denmark ............... 0105/91

[51] Int. Cl.⁶ .......................... H01L 31/052
[52] U.S. Cl. ................................... 136/246
[58] Field of Search ........................ 136/246

[56] References Cited
U.S. PATENT DOCUMENTS 4,427,838  1/1984  Goldman .................. 136/248
4,710,588  12/1987  Ellion ..................... 136/206

FOREIGN PATENT DOCUMENTS 2910142  9/1980  Germany ................. 136/246
2924510  1/1981  Germany ................. 136/246
58-135683  8/1983  Japan .................... 136/246
61-292970  12/1986  Japan ................... 136/246
62-101085  5/1987  Japan .................... 136/246
3-22573  1/1991  Japan ...................... 136/246

OTHER PUBLICATIONS

"Condenser Type Solar Battery Device", abstract of JP 57-2581, Patent Abstracts of Japan, 6(60):E102 (1982).
"Semiconductor Photodetector", abstract of JP 63-161680, Patent Abstracts of Japan, 12(423):E680 (1988).

Primary Examiner—Aaron Weisstuch
Attorney, Agent, or Firm—Finnegan, Henderson, Farabow, Garrett & Dunner

[57] ABSTRACT

The solar cell module comprises a housing (10) having at least one aperture (15) with associated concentrator (12). Light energy, propagated along the optical principal axis (45) of the concentrator, passes through the aperture (15) and is concentrated on a primary photoactive area (20). The solar cell module moreover comprises a secondary photoactive area (30) arranged in the housing (10) so as to be illuminated by light energy which is propagated in a direction different from the optical principal axis (45) of the concentrator.

10 Claims, 2 Drawing Sheets

SOLAR CELL MODULE

FIELD OF THE INVENTION

The invention concerns a solar cell module comprising a housing with at least one aperture with an associated concentrator, where light energy, which is propagated along the optical principle axis of the concentrator, passes through the aperture and is concentrated on a photoactive area.

BACKGROUND OF THE INVENTION

In recent years much research work has been devoted to solar cells, and this has i.a. entailed an increased interest in solar cell modules of the above-mentioned type. These modules have a significant advantage, since the active area of the module is determined by the area of the concentrator, and such a concentrator may e.g. be a lens or a mirror. The concentrator is expediently a Fresnel lens, since these can be made of a plastics material, thereby minimizing the manufacturing costs. At the same time, Fresnel lenses have a significant advantage, since the lens thickness is reduced, so that the concentrator is very light in this case. When the optical principal axis of the concentrator is directed to the sun, the latter will be imaged in the focal point of the concentrator. Light energy having a very high intensity level will be concentrated around the focal point, so that the solar cell, which is to convert this light energy into electric energy, must be of a very high quality, e.g. made of monocrystalline silicon or gallium arsenide. For best possible utilization of the area of this solar cell, a second optical element is usually positioned in front of the solar cell, said optical element being constructed such that the light energy is distributed evenly over the active areas of the entire solar cell. A plurality of solar cell modules of this type are then assembled to provide a solar cell panel of matrix shape. Since, owing to the imaging properties of the concentrator, the solar cells only receive light energy which is propagated along the optical principal axis of the concentrator, the panel must be mounted on a device so that the panel can follow the travel of the sun across the sky. This technique is known and described in e.g. "Conference Record of The Twentieth IEEE Photovoltaic Specialists Conference, 1988, Volume II", pages 1138–1143 by Don Carroll.

Solar cell panels of this type operate satisfactorily when the optical principal axis of the concentrator is directed to the sun. In cloudy weather the visual field of the panel does not contain a powerful light source in the form of the sun, since the incident light will be in the form of diffuse light from all directions. The advantages of the concentrator by concentrating light from an area corresponding to e.g. 500 times the area of the solar cell, are thus gone. A solar cell panel of that type is therefore useful only in regions where a reasonable number of sunshine hours per day is certain with some statistical probability, it being thus certain that the solar influx is mainly direct influx. Therefore, it is not attractive to use such a solar cell panel in large parts of the world, since it must be considered unreliable depending upon the light conditions.

OBJECT OF THE INVENTION

The object of the invention is to improve solar cell panels of the above-mentioned type such that they also give a reasonable electric output even if they are not irradiated directly by the sun.

SUMMARY OF THE INVENTION

This object is achieved in that each individual solar cell module is provided with a secondary photoactive area which is arranged in the housing so as to be irradiated with light energy, which is propagated in a direction different from the optical principal axis of the concentrator.

The primary photoactive area is expediently provided on the rear wall of the housing on the optical principal axis of the concentrator, while the secondary photoactive areas can then expediently be provided at least on part of the other inner walls of the housing. Light passing the concentrator in a direction different from its principal axis can then be collected and converted to electric energy by solar cells provided on the walls of the housing. The parts of the walls of the housing which are not coated with solar cells, may then be provided with reflecting layers, whereby the light energy is reflected until it is collected by a solar cell. If the solar cell module is incorporated in a solar cell panel together with several other modules, the side walls facing the other modules may be transparent so that light can freely move from one solar cell module to another, thus enabling a reduction in the area of solar cells in the secondary photoactive areas.

The concentrator may expediently be provided in the inlet opening of the housing and be a Fresnel lens. Other imaging components may be used as a concentrator, including ordinary lenses, holographic lenses, and concave mirrors. The primary photoactive area preferably comprises a high quality solar cell, e.g. made of monocrystalline silicon or gallium arsenide. To increase the efficiency of this solar cell, it may be connected to a cooling element, a Peltier element. The secondary photoactive area is not illuminated by light of the same high intensity as the primary photoactive area, so that the solar cells used here may be made of cheaper materials, e.g. polycrystalline or amorphous silicon.

The housing may expediently be constructed so that its walls conform to the imaging of the sun by the concentrator on the primary photoactive area. Thus, the housing has a cross-section which decreases along the optical principal axis of the concentrator toward the rear wall of the housing. The housing thus has the shape of a truncated cone or pyramid with the concentrator arranged in the large base face of the housing and the primary photoactive area in the small base face.

BRIEF DESCRIPTION OF THE DRAWINGS

The invention will be explained more fully below in connection with preferred embodiments and with reference to the drawings, in which FIG. 1 schematically shows an embodiment of a solar cell module according to the invention, FIG. 2 schematically shows a second embodiment of a solar cell module according to the invention.

DESCRIPTION OF PREFERRED EMBODIMENTS

Figure 1:
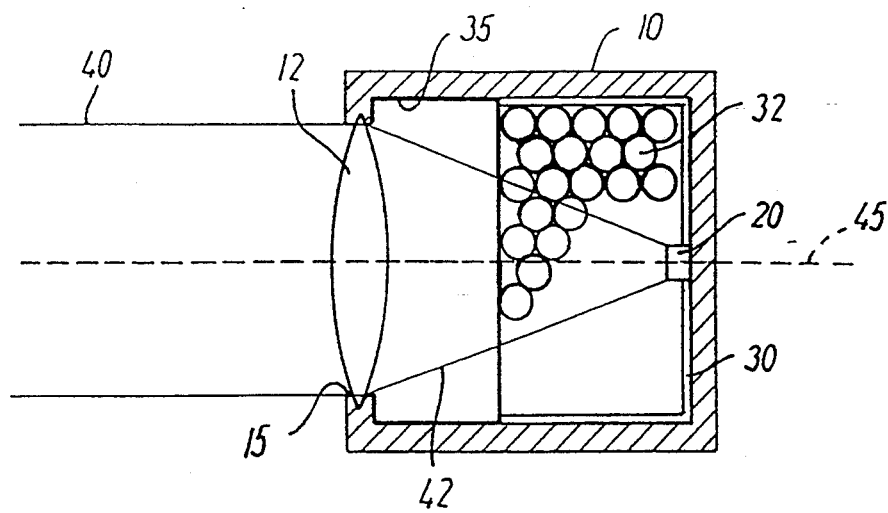

FIG. 1 shows a preferred embodiment of a solar cell module according to the invention, the solar cell module having a housing 10. The walls of the housing 10 may e.g. be made of plastics. At its one end the housing 10 has an aperture 15 in which a concentrator 12 is positioned. The concentrator 12 is here an optically imaging element focusing incident light on a primary solar cell 20. The concentrator 12 has an optical principal axis 45, a light beam 40, which propagates in parallel with this optical principal axis 45, passing through the concentrator 12 and being imaged on the primary solar cell 20. The area of the concentrator 12 thus decides the size of the light beam 40 and thus the quantity of light passing into the housing 10. It is known to move such a solar cell module so that the optical principal axis 45 of the concentrator 12 is made to aim at the sun. Part of the other inner walls of the solar cell module is here coated with a secondary photoactive area 30 consisting of densely positioned solar cells 32, which are shown to be circular. The remaining part of the walls of the housing 10 may then expediently be coated with a reflecting material 35, which may optionally also be applied to the walls rearwardly of the positioned circular solar cells 32. The solar cell module can hereby collect energy from diffused light passing the concentrator in a direction different form its optical principal axis. This diffuse light may be due to refraction of the solar light in the atmosphere before the solar light reaches the solar cell module. This refraction usually takes place in water vapor, such as by passage through cloud layers, as well as in foggy weather. The diffuse light may also comprise light reflected from the surface of the earth.

Figure 4:
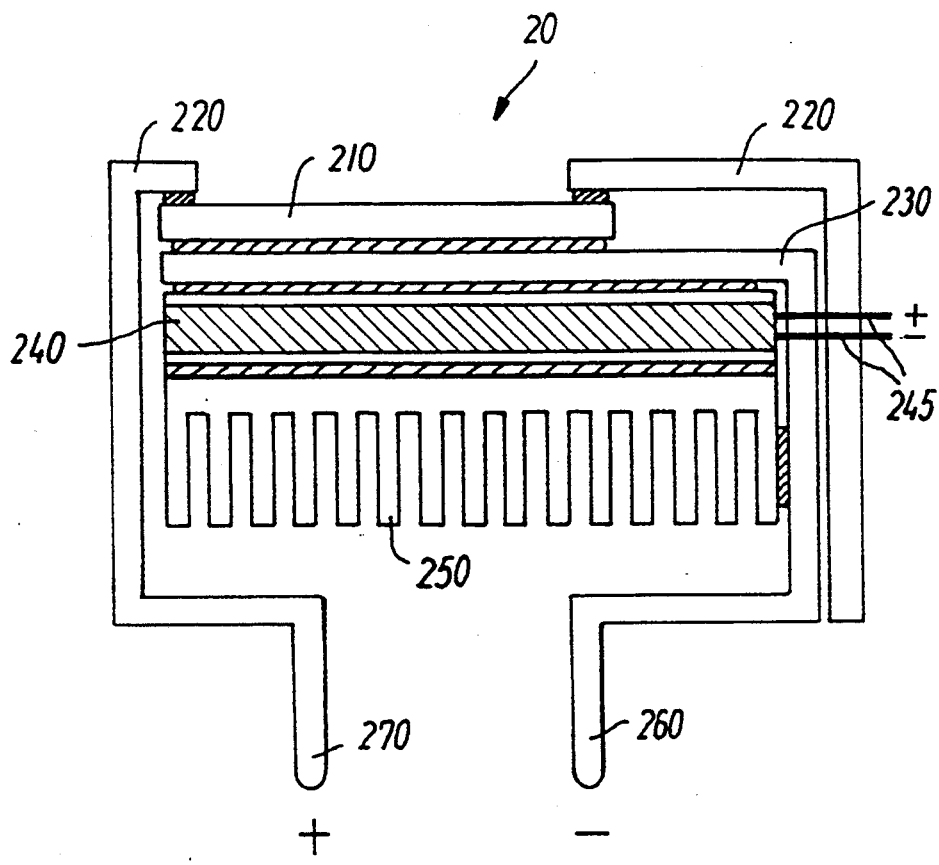
FIG. 4 shows a preferred embodiment of a primary solar cell for use in the solar cell modules shown in FIGS. 1 and 2.

This configuration ensures a higher solar cell module efficiency, efficiency being here understood to mean the relationship between the electric power that the solar cell module can generate and the power of the light energy passing the concentrator 12. Here, the primary photoactive area 20 consists of a high-effective solar cell of monocrystalline silicon or gallium arsenide. Such a solar cell is relatively expensive, but is necessary here since the light intensity power is relatively great, which gives a relatively high operating temperature. This operating temperature may be reduced considerably by cooling of the solar cell 20 which may e.g. take place by using a Peltier element, which, as shown in FIG. 4, may be incorporated as an integrated part of the solar cell. It is hereby possible to lower the operating temperature of the solar cell to a temperature at which the efficiency of the primary solar cell is relatively high.

Figure 5:
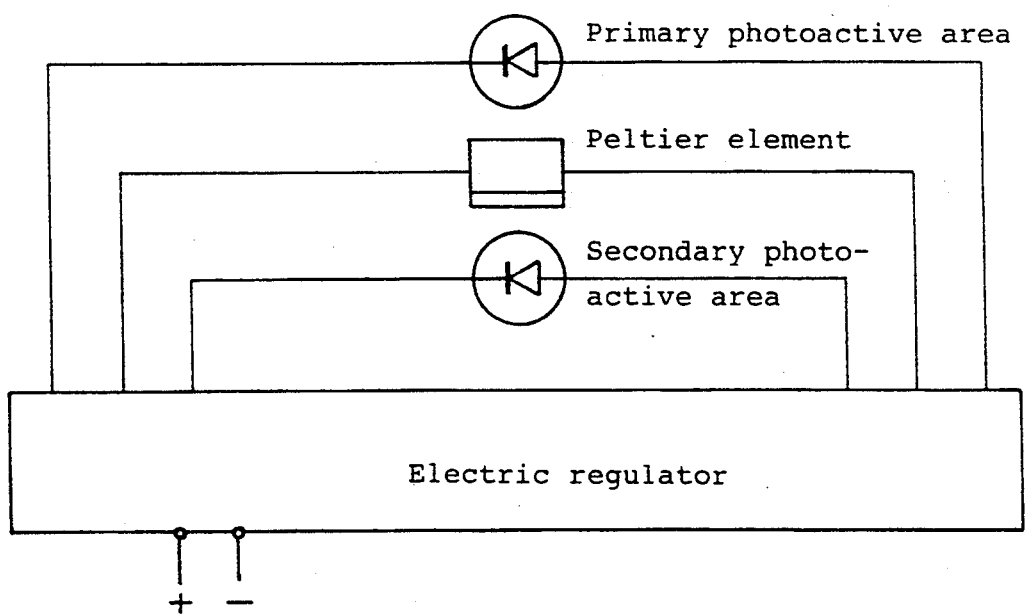
FIG. 5 shows an electrical equivalent diagram of a preferred embodiment of a solar cell module according to the invention.

In this embodiment the secondary photoactive area 30 is composed of a plurality of circular solar cells 32, some of which are shown. These solar cells 32 may expediently be connected in series; these connections are omitted for clarity and must be considered prior art since they are known from ordinary solar cell panels. If the secondary photoactive area contains a large number of individual solar cells, these may be assembled to parallel-connected chains of series-connected solar cells. Each of these chains is then connected to an electric regulator, which will be mentioned in connection with FIG. 5. Since the individual solar cells are connected in series, it is expedient that the individual solar cells comprise a parallel-connected bypass diode which is integrated in the actual solar cell. In case of failure the solar cell will thus not interrupt the series connection, but instead operate as a diode. The solar cells 32 are illuminated by light having a low intensity with respect to the light illuminating the primary solar cell 20. Therefore, it is not necessary that the solar cells 32 are of the same high quality as the solar cell 20, but may be made of a considerably cheaper material. The solar cells 32 may e.g. be made of amorphous silicon or polycrystalline silicon.

Figure 2:
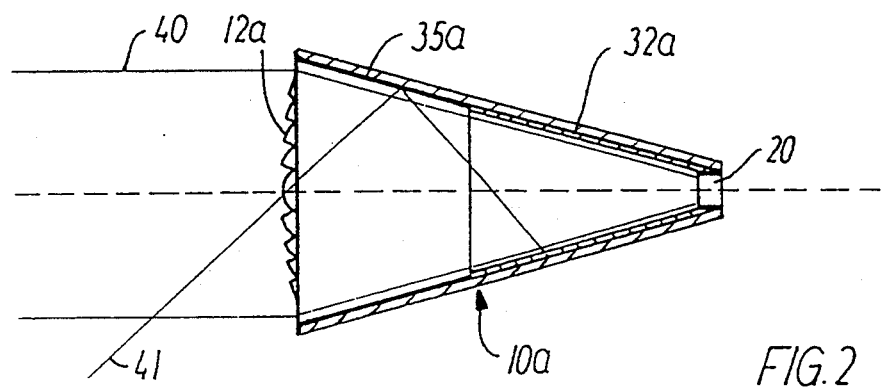

FIG. 2 shows an alternative embodiment of a solar cell module according to the invention. The housing 10a is here given the shape of a truncated pyramid or a truncated cone, it being adapted to the shape of the imaging of the plane beam 40 by the concentrator 12a. In this case the concentrator 12a is a Fresnel lens, which is expedient to use owing to its low weight when the solar cell module is to be mounted on a device and be caused to follow the movements of the sun. The actual housing is here cone-shaped, the primary solar cell 20 being arranged at the vertex of the housing. Part of the inner side of the housing 10a is provided with a secondary photoactive area 32a, which, like in the previous case, may consist of circular solar cells or may consist of a contiguous solar cell made e.g. by sputtering. Here too, part of the inner wall of the housing 10a is provided with a reflecting material 35a. A beam 41, propagating in a direction different from the optical principal axis of the concentrator 12a, is refracted in the concentrator 12a and continues into the housing 10a. The beam 41 continues into the housing 10a and impinges on the inner wall and is reflected toward the secondary photoactive area 32a in a point on the reflecting face 35a.

Figure 3:
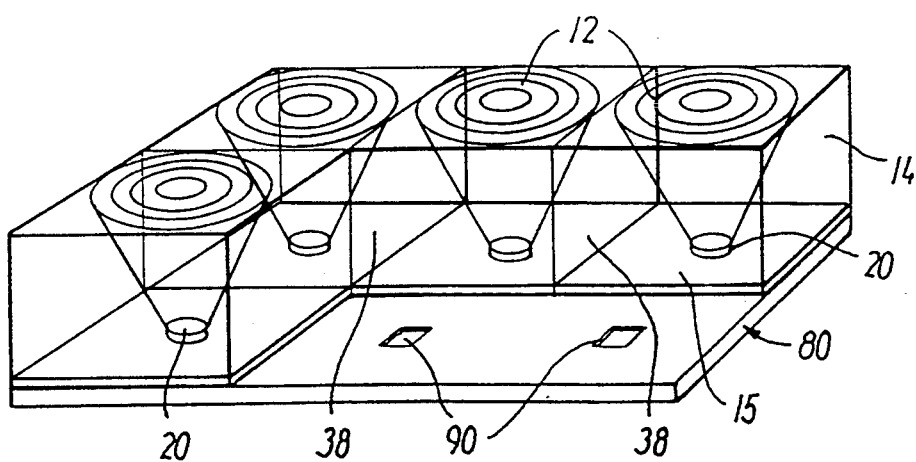
FIG. 3 shows a solar cell panel with a plurality of solar cell modules according to the invention.

FIG. 3 shows how the solar cell module shown in FIG. 1 may be used for constructing a solar cell panel. In the shown example the panel comprises a rear plate 80, with a contact area 90 for each solar cell module. Each of these solar cell modules comprises a housing with an opening mounting a concentrator 12 in the form of a Fresnel lens, the concentrator 12 imaging incident light on a primary photoactive area 20. The solar cell panel is composed of solar cell modules arranged closely spaced to one another, and the adjacent sides 38 of these modules may expediently be transparent so that the light is allowed to move freely from one module to another. On the other hand, the outer sides 14 of the panel are expediently opaque. The outer sides 14 are expediently fully or partly coated with a secondary photoactive area on the inner side, which is also the case for the bottom 15. The rear side of each solar cell module may expediently be provided with complementary contact means ensuring both mechanical and electric contact to the contact areas 90 on the base plate 80 of the solar cell panel. The secondary solar cell area may be shaped as shown in FIG. 1. For clarity, two of the solar cell modules have been removed from the solar cell panel.

It is possible to provide the solar cell module with transparent outer sides 14, so that light is also permitted to pass that way. The inner side of the transparent sides 14 may then be coated with bi-facial solar cells, thereby making it possible to increase the power from such a solar cell module additionally.

FIG. 4 schematically shows a cross-section of a solar cell 20. This solar cell is constructed with a monocrystalline silicon crystal 210, on whose upper side incident light is focused by the concentrator 12 shown in FIG. 1. A copper housing 220, also serving as an electric and thermal conductor, is soldered onto the contact areas on the front sides of the solar cell 210. The copper housing 220 has electric contact to a contact leg 270. The rear side of the solar cell 220 is soldered to a copper heating bridge 230. This copper heating bridge, too, serves as a thermal and electric conductor. The copper heating bridge 230 has electric contact to an electric contact leg 260. The rear side of the copper heating bridge 230 is soldered to a ceramic front side of a Peltier element 240. The ceramic rear side of the Peltier element 240 is in thermal contact with a cooling element 250 having cooling fins. The cooling element 250 is moreover in contact with the copper heating bridge 230.

The Peltier element 240 has two +/− wires 245. The primary photoactive area 20 thus has four output terminals—two from the Peltier element and two from the actual solar cell. As will be seen from the equivalent diagram on FIG. 5, these may be run to an electric voltage regulator, which is also connected to the row of solar cells in the secondary photoactive area. The primary cell and the secondary cells apply voltage in response to the intensity of incident light. When subjected to a certain temperature difference between the front side and the rear side, the Peltier element per se generates a current, while serving as a cooling element. If additional cooling of the primary solar cell is needed, voltage may be applied to the Peltier element to improve its cooling properties. The electric regulator may be provided with means for controlling the voltage across the Peltier element, so that this is provided with voltage in case of high incident light intensity, thereby operating as an active cooling element, or operates passively and generates a current thereby in case of low incident light intensity.

The concentration factor, the ratio of concentrator area to primary solar cell area, is typically between 20 and 500. With the present invention it is expedient that the factor is as great as possible.

It has been found possible by tests to convert more than 25% of the light energy passing the concentrator into electric energy.

I claim:

1. A solar cell module comprising a housing having at least one aperture, a concentrator, and a primary photoactive area, the concentrator being associated with the aperture so that light energy propagated along the optical principal axis of the concentrator passes through the aperture and is concentrated on the primary photoactive area, and a secondary photoactive are arranged in the housing so as to be irradiated by light energy which is propagated in a direction different from the optical principal axis of the concentrator.

2. A solar cell module according to claim 1, wherein the concentrator is mounted in the aperture of the housing.

3. A solar cell module according to claim 1 or 2, wherein the concentrator is a Fresnel lens.

4. A solar cell module according to claim 1, wherein the housing has inner walls, including a rear wall, and the primary photoactive area is provided on the rear wall of the housing on the optical principal axis of the concentrator, and the secondary photoactive area is provided at least on part of the other inner walls of the housing.

5. A solar cell module according to claim 4, wherein at least a part of the walls of the housing is transparent.

6. A solar cell module according to claims 4, wherein at least a part of the walls of the housing is reflecting.

7. A solar cell module according to claim 4, wherein the housing has a cross-section decreasing transversely to the optical principal axis of the concentrator toward the rear wall of the housing.

8. A solar cell module according to claim 7, wherein the housing has the shape of a truncated cone or pyramid.

9. A solar cell module according to claims 1, wherein the primary photoactive area comprises a solar cell made of monocrystalline silicon or gallium arsenide.

10. A solar cell module according to claim 9, wherein the solar cell in the primary photoactive area is mounted on a Peltier element.

* * * * *